(12) United States Patent
Takai et al.

(10) Patent No.: US 6,469,333 B1
(45) Date of Patent: Oct. 22, 2002

(54) SEMICONDUCTOR DEVICE HAVING A FERROELECTRIC FILM AND A FABRICATION PROCESS THEREOF

(75) Inventors: Kazuaki Takai; Kouji Tani, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/538,230

(22) Filed: Mar. 30, 2000

(30) Foreign Application Priority Data

Jul. 29, 1999 (JP) .......................................... 11-215600

(51) Int. Cl.⁷ ............................................... H01L 29/72
(52) U.S. Cl. .................... 257/295; 257/532; 257/632
(58) Field of Search ................................ 257/295, 632, 257/532

(56) References Cited

FOREIGN PATENT DOCUMENTS

| JP | 06290984 A | 10/1994 | |
|----|------------|---------|---------|
| JP | 06290984 | * 10/1994 | ................. 257/295 |
| JP | 09307074 A | 11/1997 | |

* cited by examiner

*Primary Examiner*—Edward Wojciechowicz
(74) *Attorney, Agent, or Firm*—Armstrong, Westerman & Hattori, LLP

(57) ABSTRACT

A semiconductor device includes a ferroelectric capacitor and a protective film of $Al_2O_3$ for blocking penetration of H2 atmosphere into the ferroelectric capacitor, wherein the $Al_2O_3$ protective film has a density of about 3.0 g/cm³ or more when the thickness of said protective film exceeds about 20 nm and a density of about 3.1 g/cm³ or more when the thickness of the protective film is about 20 nm or less.

26 Claims, 8 Drawing Sheets

US 6,469,333 B1

SEMICONDUCTOR DEVICE HAVING A FERROELECTRIC FILM AND A FABRICATION PROCESS THEREOF

CROSS-REFERENCE TO RELATED APPLICATION

The present application is based on Japanese priority application No.11-215600 filed on Jul. 29, 1999, the entire contents of which are hereby incorporated by reference.

BACKGROUND OF THE INVENTION

The present invention generally relates to semiconductor devices and more particularly to a ferroelectric capacitor for use in a semiconductor device and a semiconductor device having such a ferroelectric capacitor. Further, the present invention relates to the fabrication process of such a semiconductor device.

Semiconductor memory devices such as DRAMs or SRAMs are used extensively in various information processing apparatuses including computer as a high-speed main memory device. On the other and, DRAMs or SRAMs are volatile in nature and the information stored therein is lost when the electric power is turned off. Thus, it has been practiced to use non-volatile magnetic disk devices as a large-capacity storage device for storing programs and data.

On the other hand, magnetic disk devices have various drawbacks in that they are bulky and mechanically fragile. Further, they consume large electric power and provide a poor access speed when reading or writing information. Thus, the use of magnetic devices have been limited to the large-capacity auxiliary storage device.

In view of the drawbacks of the magnetic disk devices, there is an increasing tendency of using an EEPROM or flash memory device as a non-volatile memory device, wherein an EEPROM or a flash memory device stores information in a floating gate electrode in the form of electric charges. Particularly, flash memory devices, having a memory cell construction similar to that of a DRAM, is suitable for constructing an integrated circuit having a very large integration density and is expected to play a major role in a large-storage device having a storage capacity comparable to that of a magnetic disk device.

On the other hand, such EEPROM or flash memory device still suffers from the problem of low access speed due to the operational principle of the device in that writing of information is achieved by injection of hot electrons into the floating gate electrode through a tunneling oxide film. Further, there arises a problem, in such an EEPROM or flash memory device, of deterioration of the tunneling insulation film when writing or erasing of information is conducted repeatedly over a prolonged time period. When the quality of the tunneling insulation film is deteriorated, writing or erasing operation of the device becomes unstable.

Meanwhile, there is a proposal of a ferroelectric semiconductor memory device referred to hereinafter as FeRAM that stores information in the form of spontaneous polarization of a ferroelectric film. An FeRAM has a construction similar to that of a DRAM in that each memory cell transistor is formed of a single MOSFET, except that the capacitor dielectric film of the memory cell capacitor is replaced with a ferroelectric film such as PZT (Pb(Zr,Ti)O$_3$), PLZT (Pb(Zr,Ti,La)O$_3$), SBT (SrBi$_2$Ta$_2$O$_9$), and the like. Thus, an FeRAM is suitable for constructing a large-scale integrated circuit similarly to a DRAM. Further, an FeRAM has an advantageous feature, due to the operational principle thereof in that the spontaneous polarization of the ferroelectric capacitor is caused by application of an electric field, in that the writing speed is improved by the factor of 1,000 or more as compared with the writing speed of an EEPROM or a flash memory device and that the electric power consumption is reduced by a factor of 10. Further, in view of the fact that the device uses no tunneling insulation film, an FeRAM is expected to allow repetition of writing information by a factor of 100,000 as compared with a flash memory device.

In a typical ferroelectric capacitor used in such an FeRAM, a ferroelectric film of PZT or PLZT is deposited on a lower electrode of Pt by a sputtering process. The ferroelectric film thus deposited is subjected to a crystallization process in an oxidizing atmosphere, and an upper electrode of Pt is deposited on the ferroelectric film thus processed. It should be noted that the ferroelectric film is amorphous right after the deposition process, and it is inevitable to conduct a crystallization process by a thermal annealing process in order to obtain a desired ferroelectric property. By conducting the thermal annealing process in the oxidizing atmosphere, the oxygen defects in the ferroelectric film are effectively compensated for at the time of the crystallization process.

In the fabrication process of a semiconductor device having such a ferroelectric capacitor, it is generally inevitable to cover the ferroelectric capacitor by depositing an interlayer insulation film or a passivation film, similarly to other semiconductor devices.

Generally, the deposition of such an interlayer insulation film is conducted by a CVD process while using a silane compound such as SiH$_4$ or Si$_2$H$_6$ as a gaseous source material. On the other hand, the CVD process using such a silane compound is conducted generally in a reducing atmosphere containing excessive H$_2$, and thus, there arises a problem in that the ferroelectric film constituting the ferroelectric capacitor is exposed to the reducing atmosphere. Thereby, the ferroelectric film easily undergoes a reduction and there again appear oxygen defects. As a result of oxygen defect formation, the spontaneous polarization or switching electric charge of the ferroelectric film is reduced substantially and the electrical performance of the ferroelectric capacitor is seriously deteriorated.

In order to attend to this problem of reduction of the ferroelectric film at the time of formation of the interlayer insulation film, Japanese Laid-Open Patent Publication 6-290984 proposes a construction in which the upper electrode is covered by a protective film of various oxides including Al$_2$O$_3$. However, the foregoing conventional proposal has not been sufficient for eliminating the reduction of the ferroelectric film and degradation of performance of the ferroelectric capacitor.

SUMMARY OF THE INVENTION

Accordingly, it is a general object of the present invention to provide a novel and useful ferroelectric capacitor and a semiconductor device having such a ferroelectric capacitor wherein the foregoing problems are eliminated.

Another object of the present invention is to provide a ferroelectric capacitor and a semiconductor device having such a ferroelectric capacitor wherein the problem of degradation of the ferroelectric capacitor at the time of thermal annealing process conducted in a reducing atmosphere is successfully eliminated.

Another object of the present invention is to provide a semiconductor device, comprising:
    a ferroelectric capacitor; and
    a protective film of Al$_2$O$_3$ covering said ferroelectric capacitor,
    said ferroelectric capacitor comprising a lower electrode, a ferroelectric insulation film formed on said lower electrode, and an upper electrode formed on said ferroelectric insulation film, wherein said protective film has a density exceeding 2.7 g/cm$^3$ when said protective film has a thickness exceeding about 20 nm, said protective film has a density exceeding 3.0 g/cm$^3$ when said protective film has a thickness less than about 20 nm.

Another object of the present invention is to provide a semiconductor device, comprising:

a ferroelectric capacitor; and a protective film of Al$_2$O$_3$ covering said ferroelectric capacitor, said ferroelectric capacitor comprising a lower electrode, a ferroelectric insulation film formed on said lower electrode, and an upper electrode formed on said ferroelectric insulation film, wherein said protective film shows an etching rate, when having a thickness exceeding about 20 nm, of less than 100 nm/min against a 10% diluted buffered HF etching solution containing 4.9% of NH$_4$F and 0.7% of HF, said protective film shows an etching rate, when having a thickness less than about 20 nm, of less than 50 nm/min against said buffered HF etching solution.

Another object of the present invention is to provide a method of fabricating a semiconductor device having a ferroelectric capacitor, comprising the step of:

covering said ferroelectric capacitor by a protective film of Al$_2$O$_3$, wherein said protective film is deposited by any of an electron cyclotron resonant plasma sputtering process or an induction-coupled high-frequency-plasma-assisted magnetron sputtering process.

According to the present invention, a dense protective film of Al$_2$O$_3$ is formed on the ferroelectric capacitor and the penetration of H$_2$ into the ferroelectric capacitor insulation film is effectively blocked. Thereby, a large switching electric charge is guaranteed for the ferroelectric capacitor insulation film.

Other objects and further features of the present invention will become apparent from the following detailed description when read in conjunction with the attached drawings.

DETAILED DESCRIPTION OF THE INVENTION

[First Embodiment]

Figure 1:
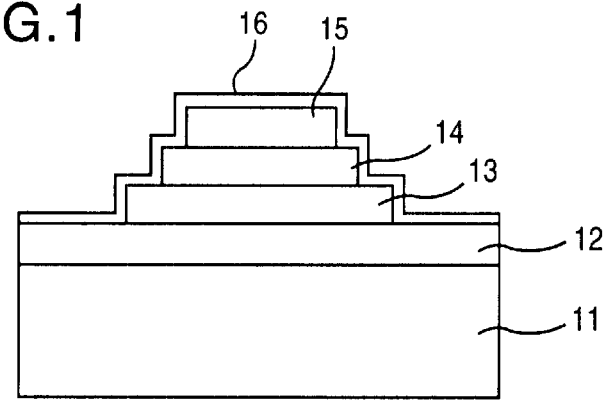
FIG. 1 is a diagram showing the construction of a ferroelectric capacitor according to a first embodiment of the present invention.

FIG. 1 shows the construction of a ferroelectric capacitor 10 according to a first embodiment of the present invention.

In the investigation that constitutes the foundation of the present invention, the inventor examined the degradation of the electrical property of the ferroelectric capacitor 10 of FIG. 1 caused as a result of thermal annealing process conducted in an H$_2$ atmosphere while providing a protective film of Al$_2$O$_3$ and changing the condition of deposition of the Al$_2$O$_3$ film variously.

Referring to FIG. 1, an SiO$_2$ film 12 is formed on an (100)-oriented Si substrate 11 by a thermal oxidation process with a thickness of about 200 nm, and a lower electrode 13 is formed on the SiO$_2$ film 12 by consecutively depositing a Ti film and a Pt film by a sputtering process with respective thicknesses of 20 nm and 200 nm. Further, a PZT film 14 is formed on the lower electrode 13 by an RF sputtering process with a thickness of about 300 nm, and an upper electrode 15 of Pt is formed further on the PZT film 14 with a thickness of about 200 nm.

In the ferroelectric capacitor 10 of FIG. 1, the PZT film 14 is formed by using a sputtering target that contains Pb, Zr and Ti with a proportion of 1.2:0.55:0.45, and the PZT film 14 thus deposited is subjected to a crystallization process by conducting a thermal annealing process in an O$_2$ atmosphere at 750° C. for 1 minute. As a result of the crystallization process conducted in the oxidizing atmosphere, the oxygen defects in the PZT film 14 is also compensated. In view of the thermal annealing process conducted in such an oxidizing atmosphere, the lower electrode 13 is formed of a conducted material such as Pt that is stable against oxidation.

By applying a patterning process that uses an RIE (reactive ion etching) process conducted in an induction-coupled plasma, to the lower electrode 13, the PZT film 14 and the upper electrode 15, the ferroelectric capacitor 10 of FIG. 1 is obtained.

In the present embodiment, a protective film 16 of Al$_2$O$_3$ is further provided on the ferroelectric capacitor 10 thus formed, according to various processes and conditions as summarized in TABLES I–III. Further, the change of electrical property is examined for such a structure having the Al$_2$O$_3$ protective film after conducting a thermal annealing process in an H$_2$ atmosphere having an H$_2$ partial pressure 0.3 Torr, for 30 minutes at 150° C.

TABLE I magnetron sputter deposition

| | |
|---|---|
| chamber pressure | 0.6 Pa |
| oxygen partial pressure | 0.1 Pa |
| D.C. power | 300 W |
| substrate temperature | room temperature |
| $Al_2O_3$ thickness | 20–100 nm |

TABLE II

ECR sputter deposition

| | |
|---|---|
| chamber pressure | 0.1 Pa |
| oxygen partial pressure | 0.02 Pa |
| $\mu$-wave power | 500 W |
| R.F. power | 500 W |
| substrate temperature | room temperature |
| $Al_2O_3$ thickness | 20–75 nm |

TABLE III

ICP-RF plasma-enhanced magnetron sputter deposition

| | |
|---|---|
| chamber pressure | 0.1 Pa |
| oxygen partial pressure | 0.01 Pa |
| cathode power | 400 W |
| R.F. power | 60 W |
| substrate temperature | room temperature |
| $Al_2O_3$ thickness | 20–100 nm |

TABLE I shows the case of forming the $Al_2O_3$ protective film 16 according to an ordinary R.F. sputtering process, while TABLE II shows the formation of the $Al_2O_3$ protective film 16 according to an ECR (electron-cyclotron-resonance) plasma sputtering process. Further, TABLE III shows the case of forming the $Al_2O_3$ protective film 16 according to an induction-coupled high-frequency-plasma-assisted magnetron sputtering process.

Figure 2:
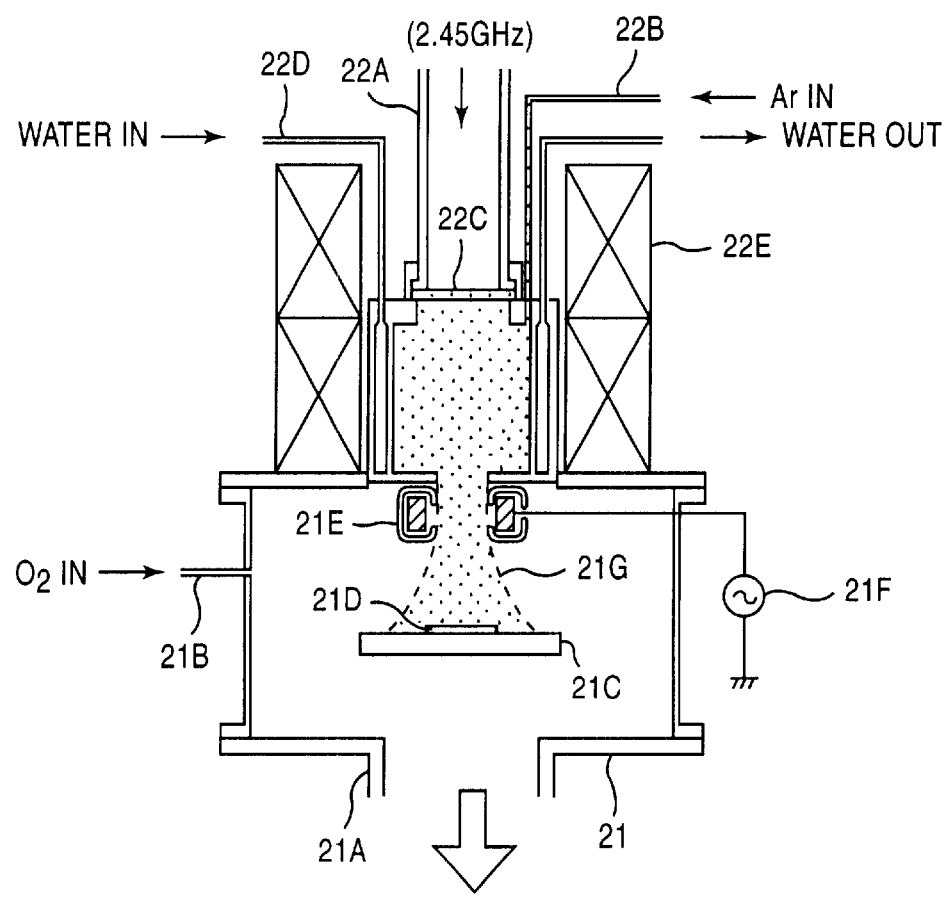
FIG. 2 is a diagram showing the construction of an ECR plasma sputtering apparatus used in the present invention.

FIG. 2 shows the construction of an ECR plasma sputtering apparatus 20 used in the experiment of TABLE II.

Referring to FIG. 2, the ECR plasma sputtering apparatus 20 is equipped with a deposition chamber 21 evacuated through an evacuation port 21A, wherein the deposition chamber 21 includes therein a substrate holder 21C for holding a substrate 21D to be processed. The deposition chamber 21 is supplied with $O_2$ through a line 21B, and a plasma chamber 22 is provided adjacent to the deposition chamber 21. The plasma chamber 21 is connected with a waveguide 22A and excites plasma in an Ar gas supplied through a line 22B by the microwave supplied to the plasma chamber 21 from the waveguide 22A. It should be noted that there is provides a quartz window 22C at the end portion of the waveguide 22A. The plasma chamber 21 is cooled by a cooling water supplied by a line 22D.

Around the plasma chamber 21, there are provided magnets 22E, and the electrons in the plasma undergoes a cyclotron motion as a result of the magnetic field induced by the magnets 22E. Thereby, the plasma in the plasma chamber 21 is injected into the deposition chamber 21 in the form of a plasma flow 21G via a passage connecting the plasma chamber 22 to the deposition chamber 21.

As indicated in FIG. 2, a target 21E of Al is disposed so as to surround the passage of the plasma flow 21G, and the target 21E experiences sputtering by the plasma flow 21G when biased by a high-frequency power source 21F. The Al particles thus sputtered are then reacted with $O_2$ supplied into the deposition chamber 21 via the line 21B, and a deposition of $Al_2O_3$ occurs on the substrate 21D, which is disposed so as to interrupt the path of the plasma flow 21G.

In the ECR sputtering process conducted by the apparatus of FIG. 2, it is possible to control the energy of the $Al_2O_3$ sputtering particles to about 20 eV, so that a dense $Al_2O_3$ film is formed on the substrate 21D.

Figure 3:
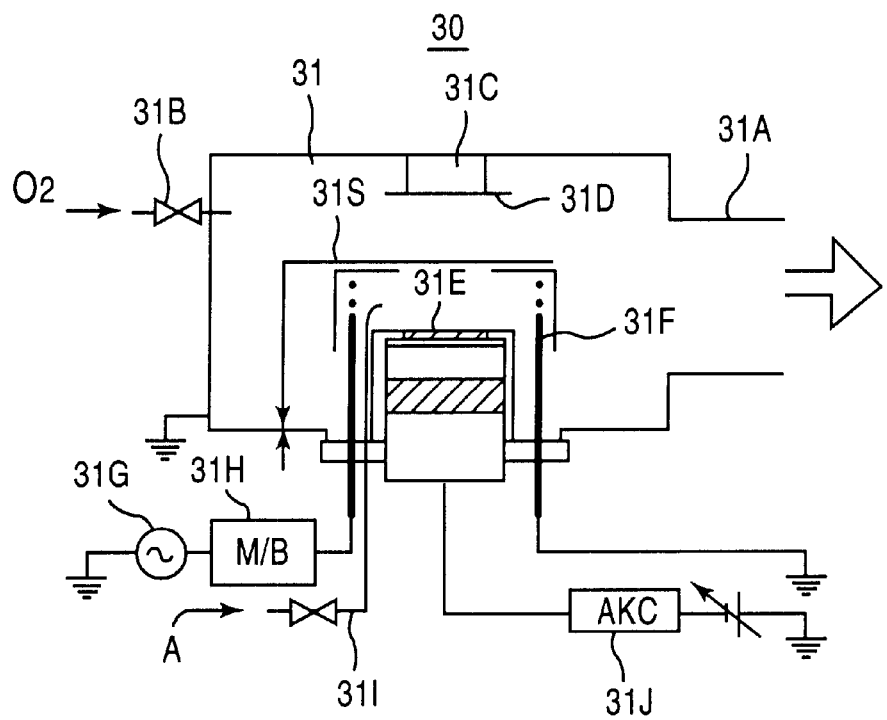
FIG. 3 is a diagram showing the construction of an induction-coupled high-frequency-plasma-assisted magnetron sputtering apparatus used in the present invention.

FIG. 3 shows the construction of an induction-coupled high-frequency-plasma-assisted magnetron sputtering apparatus 30 used in the experiment of TABLE III.

Referring to FIG. 3, the sputtering apparatus 30 includes a deposition chamber 31 evacuated through an evacuation port 31A, wherein the deposition chamber 31 is supplied with $O_2$ from a line 31 and accommodates therein a substrate holder 31C adapted to carry a substrate 31D thereon. Further, an Al target 31E is provided in the deposition chamber 31 so as to face the substrate 31D on the substrate holder 31C, and an antenna or coil 31F is provided around the target 31E.

In the sputtering apparatus 30 having such a construction, an Ar gas is introduced into the deposition chamber 31 in the vicinity of the target 31E via a line 31I, and a radio-frequency power of typically 13.56 MHz is supplied from an R.F. power source 31G to the coil 31F via a matching box 31H for exciting the Ar gas thus introduced into the deposition chamber 31. As a result, an induction-coupled Ar plasma is induced in the deposition chamber 31 and the plasma thus induced is directed to the Al target 31E by displacing a shutter member 31S of the target 31E.

The Al particles thus sputtered from the target 31E then reach the surface of the substrate 31D and deposit thereon in the form of $Al_2O_3$ after oxidation by the $O_2$ gas from the line 31B.

In such an induction-coupled high-frequency-plasma-assisted magnetron sputtering apparatus 30, there occurs an efficient ionization in the sputtered particles as they move in the induction-coupled plasma, and as a result, a dense $Al_2O_3$ film is formed on the substrate 31D. In the illustrated example, an arc killer 31J is connected to the holder holding the target 31E.

Figure 4:
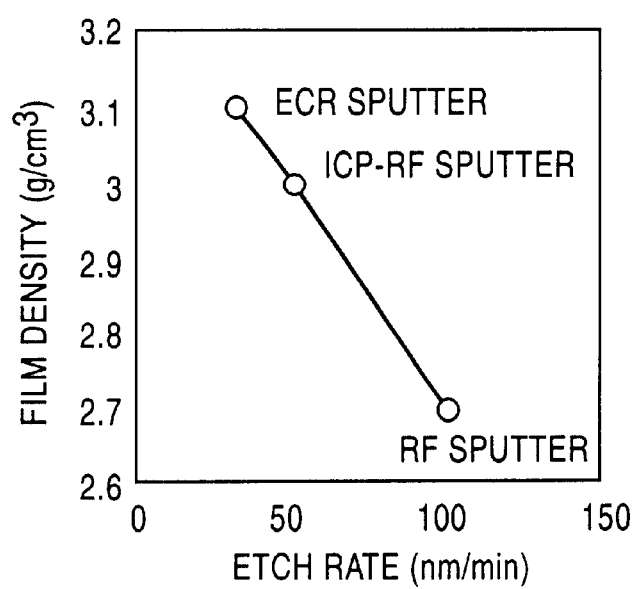
FIG. 4 is a diagram showing the relationship between the density and the wet etching rate for various Al$_2$O$_3$ films formed according to various processes.

FIG. 4 shows the relationship between the density of the $Al_2O_3$ films formed according to the conditions summarized in TABLE I–III and the wet etching rate thereof for the case when a wet etching process is conducted by using a buffered HF solution diluted to 10% and containing $NH_4F$ and HF with respective concentrations of 4.9% and 0.7%.

Referring to FIG. 4, it can be seen that the etching rate of the $Al_2O_3$ film decreases generally linearly with increasing film density. In the case ordinary magnetron sputtering process is used as represented in TABLE I, it is noted that the maximum density of the $Al_2O_3$ film achieved is only 2.7 g/cm$^3$. In the case of Table II in which the ECR plasma sputtering process is employed, on the other hand, a film density of about 3.1 g/cm$^3$ is achieved for the $Al_2O_3$ film. Similarly, a film density of about 3.0 g/cm$^3$ is achieved by using the induction-coupled high-frequency-plasma-assisted magnetron sputtering explained with reference to FIG. 3.

Thus, according to the present invention, it becomes possible to form the $Al_2O_3$ film constituting the protective film 16 in the ferroelectric capacitor of FIG. 1 with high density sufficient for blocking the penetration of $H_2$ during the thermal annealing process conducted in an $H_2$ atmosphere, by employing the ECR plasma sputtering process as represented in TABLE II or by employing the induction-coupled high-frequency-plasma-assisted magnetron sputtering process as represented in TABLE III. Thereby, the problem of reduction of the ferroelectric film

14 by $H_2$ thus penetrated into the ferroelectric capacitor is effectively and successfully eliminated.

Experiment 1

Figure 5A:
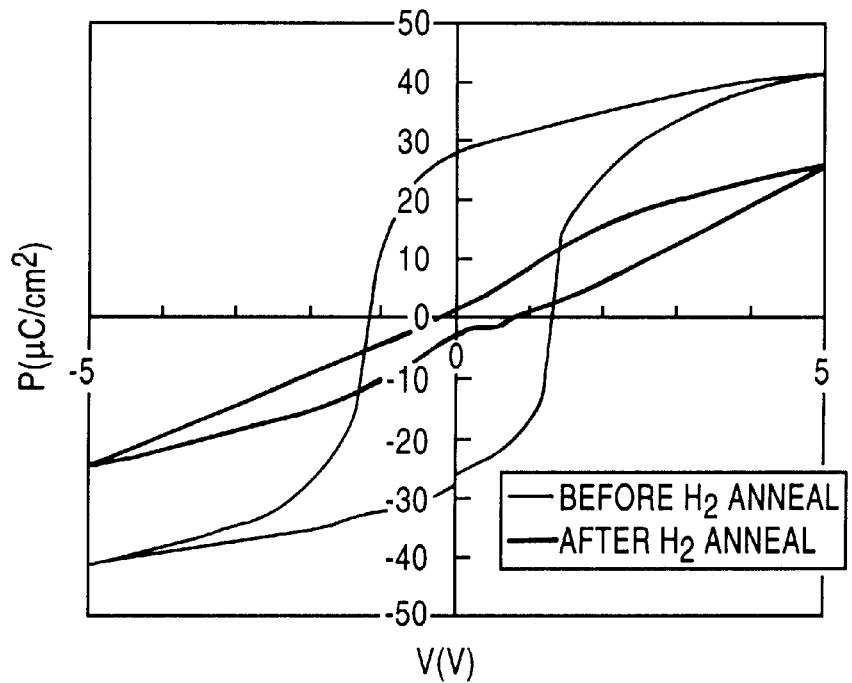
FIGS. 5A–5C are diagrams comparing the electric property of the ferroelectric capacitor of FIG. 1 before and after a thermal annealing process in an H$_2$ atmosphere.

FIG. 5A shows the change of the electrical property, particularly the hysteresis, of the ferroelectric capacitor 10 of FIG. 1 before and after a thermal annealing process conducted in an $H_2$ atmosphere, for the case in which the $Al_2O_3$ protective film 16 is deposited under the condition of TABLE I with a thickness of about 50 nm.

Referring to FIG. 5A, it can be seen that a large hysteresis of the ferroelectric capacitor 10 is reduced substantially as represented in FIG. 5A by a thick line, after conducting a thermal annealing process in an $H_2$ atmosphere, $H_2$ partial pressure thereof being set to 0.3 Torr, at 150° C. for 30 minutes. The result of FIG. 5A clearly indicates that the $Al_2O_3$ protective film 16 deposited by the ordinary magnetron sputtering process is not effective for blocking the penetration of $H_2$ into the PZT film 14 of the ferroelectric capacitor 10 and that substantial reduction is caused in the PZT film 14.

Experiment 2

Figure 5B:
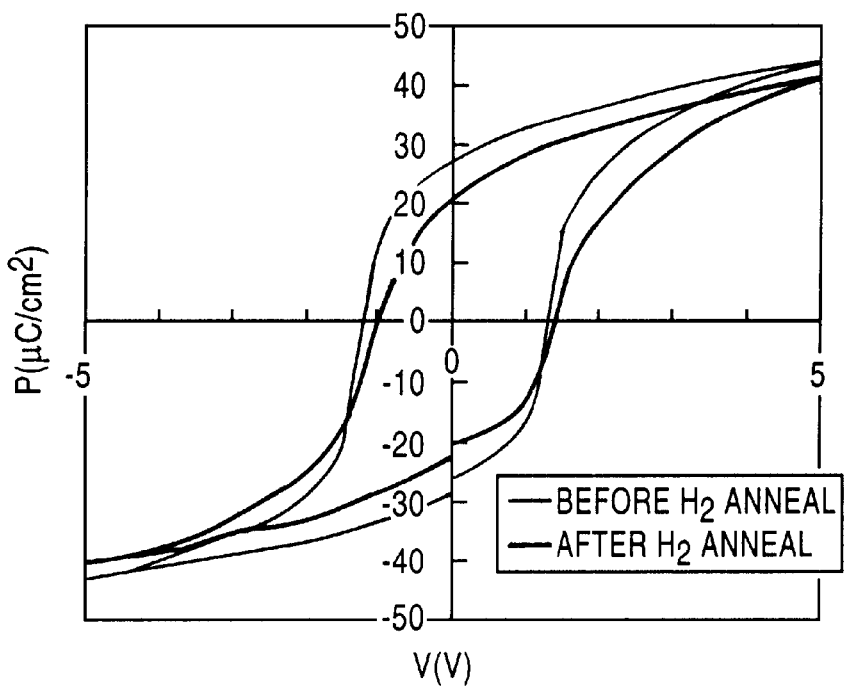

FIG. 5B, on the other hand, shows the change of the hysteresis characteristic of the ferroelectric capacitor 10 before and after the thermal annealing process conducted in an $H_2$ atmosphere, for the case in which the $Al_2O_3$ protective film 16 is deposited under the condition of TABLE II with a thickness of about 50 nm. Similarly as before, the thermal annealing process was conducted in an $H_2$ atmosphere having the $H_2$ partial pressure of 0.3 Torr at the temperature of 150° C. for 30 minutes.

Referring to FIG. 5B, it can be seen that the hysteresis loop of the ferroelectric capacitor 10 does not change substantially before and after the thermal annealing process, and a large hysteresis loop is maintained even after the thermal annealing process. The result of FIG. 5B clearly indicates that the $Al_2O_3$ protective film 16 deposited by the process of TABLE II is dense enough for blocking the penetration of $H_2$ into the PZT film 14 of the ferroelectric capacitor 10 and that reduction in the PZT film 14 is effectively suppressed even when the thermal annealing process is conducted in the $H_2$ atmosphere.

Experiment 3

Figure 5C:
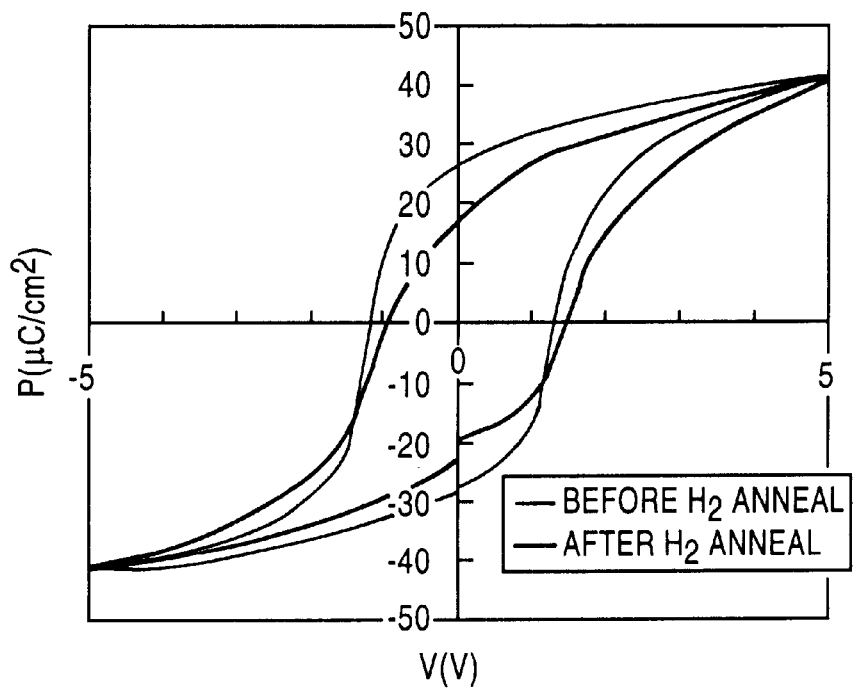

FIG. 5C shows the change of the hysteresis characteristic of the ferroelectric capacitor 10 before and after the thermal annealing process conducted in an $H_2$ atmosphere, for the case in which the $Al_2O_3$ protective film 16 is deposited under the condition of TABLE III with a thickness of about 50 nm. Similarly as before, the thermal annealing process was conducted in an $H_2$ atmosphere having the $H_2$ partial pressure of 0.3 Torr at the temperature of 150° C. for 30 minutes.

Referring to FIG. 5C, it can be seen that the hysteresis loop of the ferroelectric capacitor 10 does not change substantially before and after the thermal annealing process, and a large hysteresis loop is maintained even after the thermal annealing process. The result of FIG. 5C clearly indicates that the $Al_2O_3$ protective film 16 deposited by the process of TABLE III is dense enough for blocking the penetration of $H_2$ into the PZT film 14 of the ferroelectric capacitor 10 and that reduction in the PZT film 14 is effectively suppressed even when the thermal annealing process is conducted in the $H_2$ atmosphere.

Figure 6:
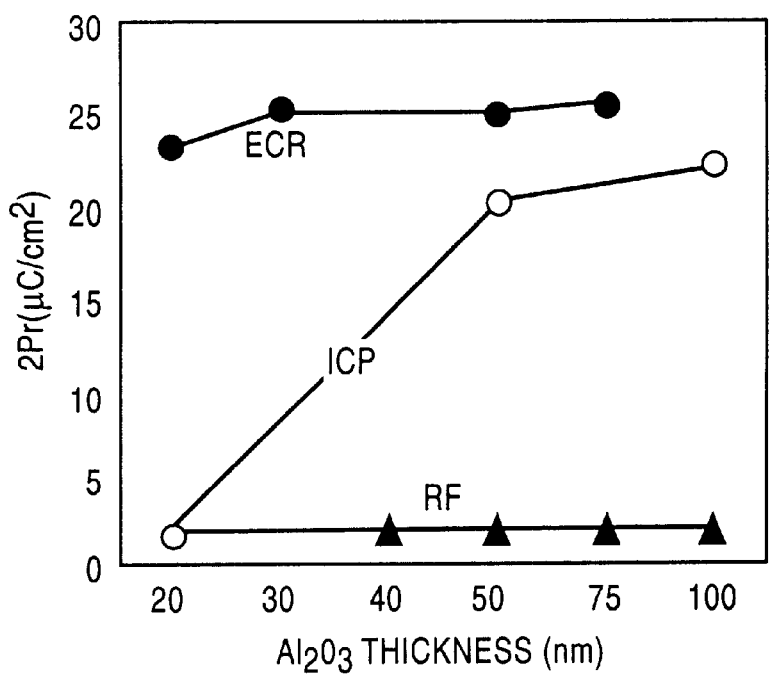
FIG. 6 is a diagram showing the relationship between the switching electric charge of a ferroelectric capacitor having an Al$_2$O$_3$ protective film and the thickness of the Al$_2$O$_3$ protective film formed according to various processes.

FIG. 6 shows the value of the remnant polarization of the PZT film 14 in the ferroelectric capacitor 10 of FIG. 1 after the thermal annealing process in the $H_2$ atmosphere for the case in which the thickness of the $Al_2O_3$ protective film 16, formed according to the conditions of TABLE I–III, is changed variously.

Referring to FIG. 6, it can be seen that the remnant polarization of the PZT film 14 after the thermal annealing process takes the value of about 2 $\mu C/cm^2$ irrespective of the thickness of the $Al_2O_3$ film 16, as long as the $Al_2O_3$ film 16 is formed according to the ordinary magnetron sputtering process as represented in TABLE I. On the other hand, FIG. 6 also indicates that a remnant polarization of as much as about 24 $\mu C/cm^2$ obtained for the PZT film 14 when the $Al_2O_3$ protective film 16 is formed according to the ECR plasma sputtering process, even in such a case in which the $Al_2O_3$ protective film 16 has a thickness of about 20 nm. Further, it can be seen that the value of the remnant polarization does not depend substantially on the thickness of the $Al_2O_3$ film thus formed according to the ECR plasma sputtering process.

In the case the $Al_2O_3$ protective film 16 is formed according to the induction-coupled high-frequency-plasma-assisted magnetron sputtering process of TABLE III, a remnant polarization of about 20 $\mu C/cm^2$ is obtained after the foregoing $H_2$ annealing process, provided that the $Al_2O_3$ film 16 is formed with a thickness of about 50 nm or more. In the case the $Al_2O_3$ film 16 is formed according to the process of TABLE III, it should be noted that the value of only about 2 $\mu C/cm^2$ is obtained for the PZT film 14 when the thickness of the $Al_2O_3$ protective film 16 is about 20 nm.

Figure 7:
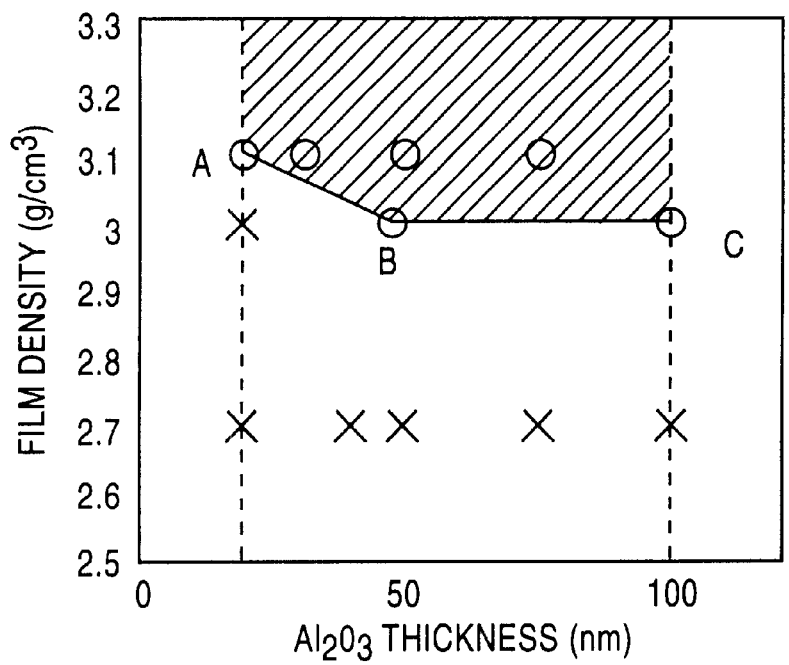
FIG. 7 is a diagram showing the relationship between the thickness and preferable film density of the Al$_2$O$_3$ film in the ferroelectric capacitor of FIG. 1.

FIG. 7 shows the relationship between the desirable film thickness of the $Al_2O_3$ protective film 16 and the film density thereof derived by combining the result of FIG. 6 and the result of FIG. 4. In FIG. 7, it should be noted that the points represented by a cross indicate the region in which the remnant polarization is reduced to the value of about 2 $\mu C/cm^2$ or less for the PZT film 14, while the points represented by an open circle indicate the region in which a remnant polarization of about 20 $\mu C/cm$ or more is secured for the PZT film 14.

Referring to FIG. 7, it is concluded that the $Al_2O_3$ protective film 16 is required to have a density substantially exceeding the value of about 2.7 $g/cm^3$ as represented in FIG. 7 by the cross-marks when the $Al_2O_3$ film 16 is to be formed with a thickness of about 20 nm or more. In the case the $Al_2O_3$ protective film 16 is to be formed with a thickness of less than about 20 nm, on the other hand, it is necessary for the $Al_2O_3$ film 16 to have a density substantially exceeding the value of about 3.0 $g/cm^3$ as represented in FIG. 7 by a cross-mark.

Preferably, the $Al_2O_3$ protective film 16 has a density exceeding about 3.0 $g/cm^3$ when the film 16 is formed with a thickness exceeding about 20 nm as represented in FIG. 7 by the open circles B and C. In the case the $Al_2O_3$ protective film 16 has a thickness less than about 20 nm, it is preferable that the $Al_2O_3$ film 16 has a density exceeding about 3.1 $g/cm^3$ as represented by the open circle A.

Figure 8:
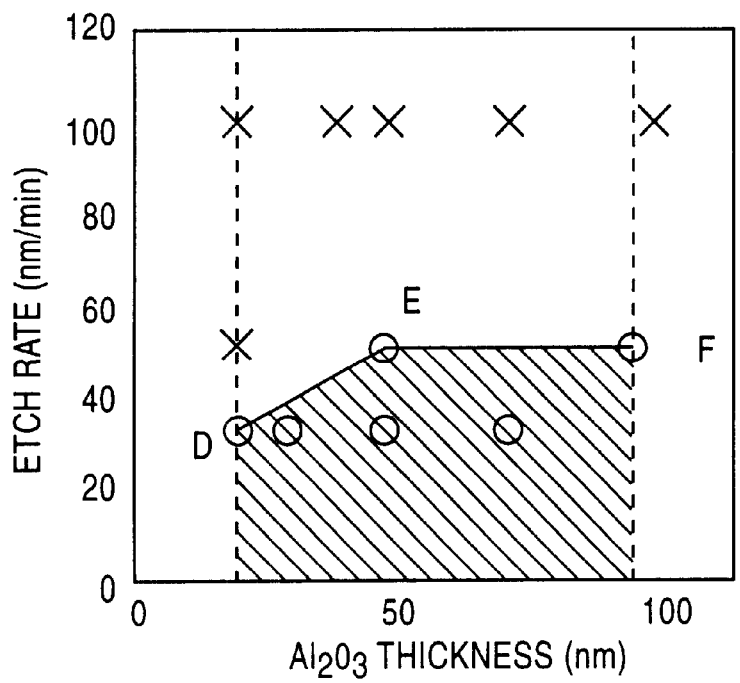
FIG. 8 is a diagram showing the relationship between the thickness and preferable etching rate of the Al$_2$O$_3$ film in the ferroelectric capacitor of FIG. 1.

FIG. 8 shows the relationship of FIG. 7 as converted in the form of a relationship between the preferable thickness of the $Al_2O_3$ protective film 16 and the etching rate thereof. As noted previously, the etching rate in FIG. 8 is the etching rate observed when the $Al_2O_3$ film 16 is subjected to a wet etching process using a 10%-diluted buffered HF solution containing therein $NH_4F$ with a concentration of about 4.9% and HF with a concentration of about 0.7% as the etchant.

In FIG. 8, it should be noted that the points represented by the cross-mark indicate the region in which the value of the remnant polarization of the PZT film 14 is reduced to about 2 $\mu$C/cm$^2$ or less, while the points represented by the open circles indicate the region in which the value of about 20 $\mu$C/cm$^2$ or more is secured for the switching charge of the PZT film 14.

Referring to FIG. 8, it is concludes that the Al$_2$O$_3$ protective film 16 should have an etching rate of less than about 100 nm/min as represented by the cross-marks in FIG. 8 in order to secure a sufficient large remnant polarization value for the PZT film 14 for the case in which the Al$_2$O$_3$ film 16 has a thickness exceeding about 20 nm. In the case the Al$_2$O$_3$ film 16 has a thickness of less than about 20 nm, on the other hand, it is necessary for the Al$_2$O$_3$ film 16 to have an etching rate of about 50 nm/min as represented in FIG. 8 by the cross-marks.

Preferably, the Al$_2$O$_3$ film 16 has an etching rate less than about 50 nm/min when the thickness thereof exceeds about 50 nm as represented by the open circles E and F, and an etching rate less than about f30 nm/min when the thickness thereof is less than about 20 nm as represented by the open circle D.

Meanwhile, in the fabrication process of the ferroelectric capacitor 10 of FIG. 1, there can be a case in which the PZT film 14 is damaged during the sputter deposition process of the Al$_2$O$_3$ protective film 16 due to the effect of the plasma associated with the sputtering process. In such a case, it is possible to recover the original spontaneous polarization after the deposition of the Al$_2$O$_3$ film 16 by conducting a thermal annealing process in an O$_2$ atmosphere.

Figure 9:
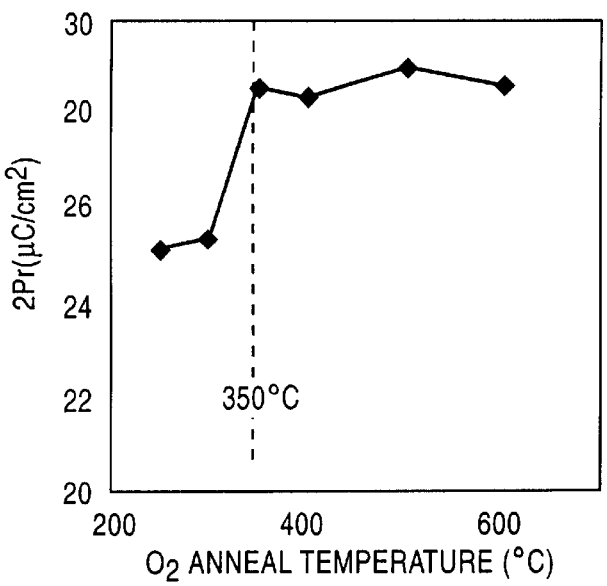
FIG. 9 is a diagram showing the recovery of the switching electric charge and the temperature of thermal annealing process conducted for the ferroelectric capacitor of FIG. 1 in an oxygen atmosphere after formation of the Al$_2$O$_3$ protective film.

Referring to FIG. 9 showing such a recovery of the spontaneous polarization as a result of the oxidizing thermal annealing process conducted after the deposition of the protective film 16, it can be seen that the remnant polarization of the PZT film 14 is improved substantially by conducting the foregoing thermal annealing process at the temperature of about 350° C. or more.

Meanwhile, the ferroelectric capacitor 10 of FIG. 1 raises a problem, when patterning the electrode 13 or the electrode 15 by a photolithographic process due to the high reflectance of Pt used for the upper or lower electrodes 15 or 13. Due to the high reflectance, the resist covering these metal layers may be unwontedly exposed. Thereby, the desired patterning of the electrodes may become difficult.

Figure 10:
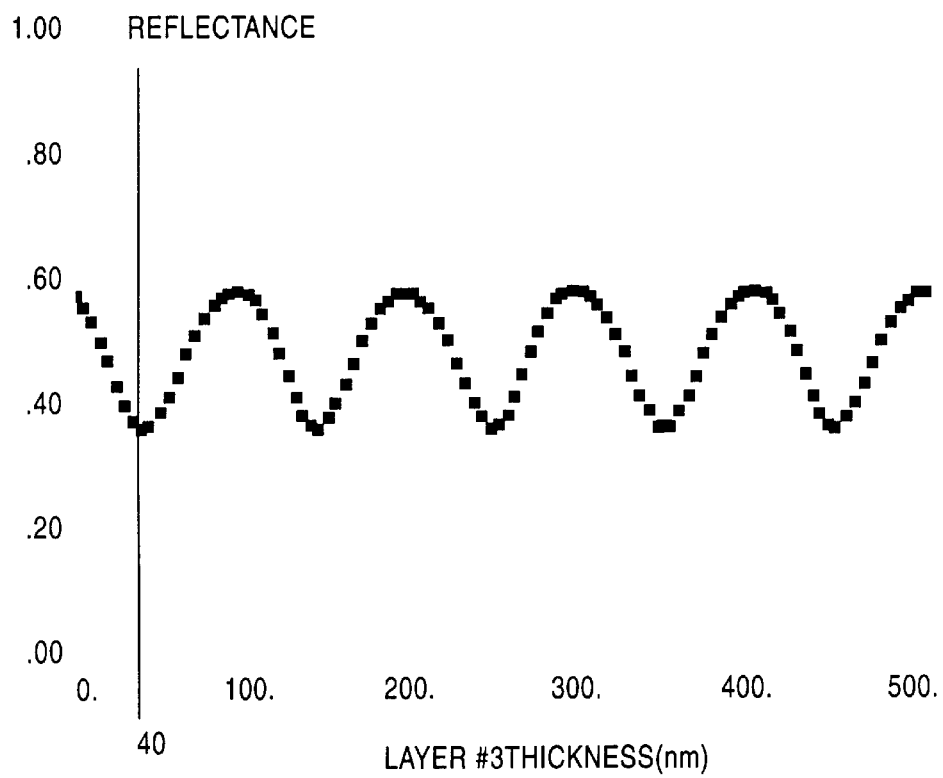
FIG. 10 is a diagram showing the function of the Al$_2$O$_3$ protective film in the ferroelectric capacitor of FIG. 1 as an anti-reflection film.

FIG. 10 shows the apparent reflectance of the Al$_2$O$_3$ film 16 before the patterning of the ferroelectric capacitor for the case in which the thickness of the Al$_2$O$_3$ film 16 is changed variously. It should be noted that the result of FIG. 10 is for the structure in which an SiO$_2$ film having a thickness of 200 nm and an SOG film having a thickness of 100 nm are further deposited on the upper electrode layer 15.

Referring to FIG. 10, it can be seen that the apparent reflectance changes periodically with the thickness of the Al$_2$O$_3$ film 16 and that the reflectance can be suppressed to about 36% by setting the thickness of the Al$_2$O$_3$ film 16 to be approximately an integer multiple of about 40 nm.

In the description theretofore, it should be noted that the upper and lower electrodes 13 and 15 are not limited to Pt but other metals such as Ir or Ru that are stable in the oxidizing atmosphere, or conductive oxides such as RuO$_2$ or SrRuO$_3$ may also be used for the material of the electrodes 13 and 15.

Further, it should be noted that the process of forming the PZT film 14 is not limited to the sputtering process but other processes such as sol-gel process or CVD process may also be employed. Further other ferroelectric material such as SrBi$_2$Ta$_2$O$_9$ or Bi$_4$Ti$_2$O$_{12}$ may also be used in place of the PZT film 14.

[Second Embodiment]

Figure 11:
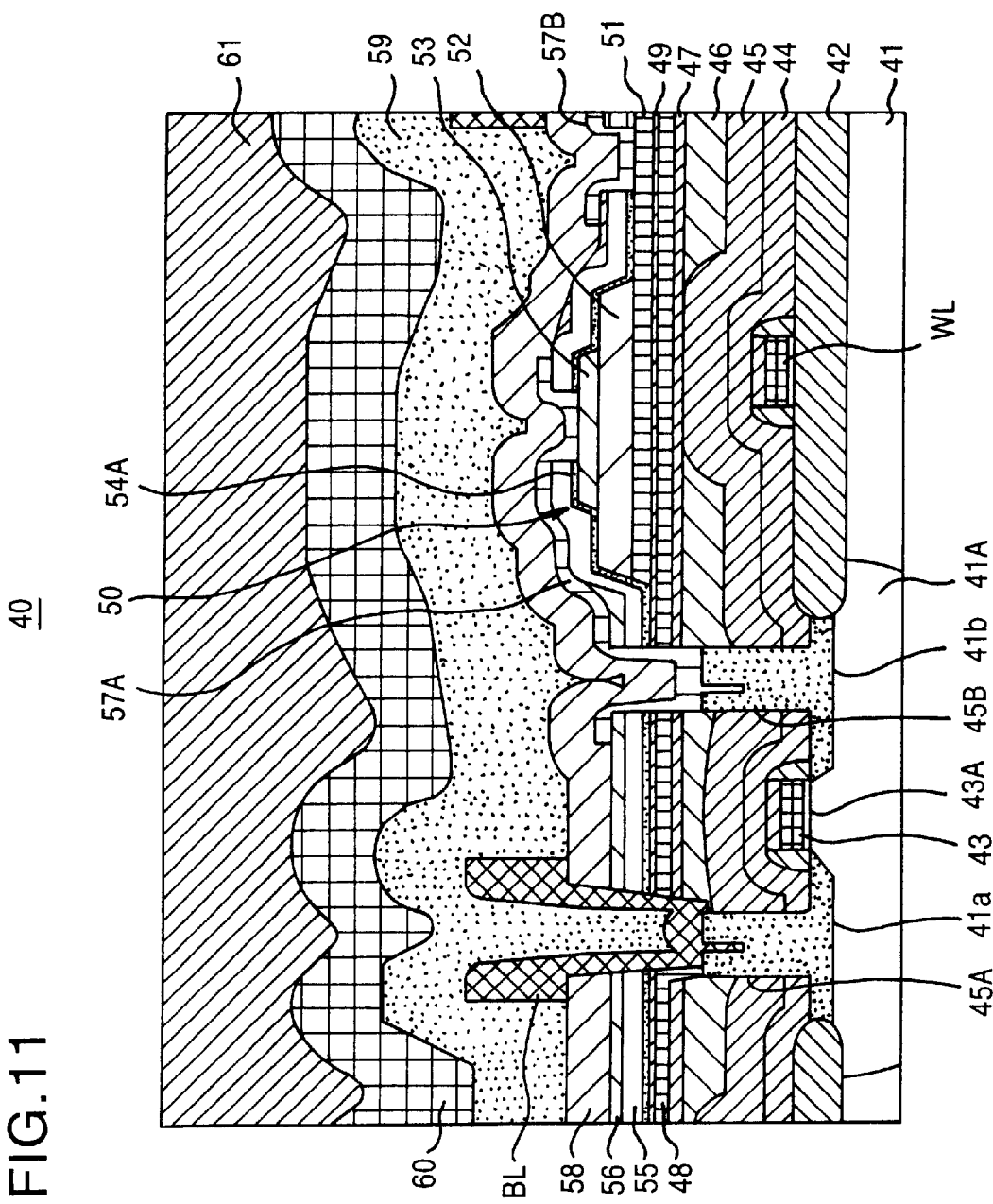
FIG. 11 is a diagram showing the construction of an FeRAM according to a second embodiment of the present invention.

FIG. 11 shows the construction of an FeRAM 40 according to a second embodiment of the present invention.

Referring to FIG. 11, the FeRAM 40 is formed on an active region defined on a Si substrate 41 by a field oxide film 42, wherein a p-type well 41A is formed in the Si substrate 41 in correspondence to the foregoing active region.

On the Si substrate 41, there is formed a gate electrode 43 in correspondence to the p-type well 41A, with a gate oxide film 43A interposed between the gate electrode 43 and the Si substrate 41. Further, n-type diffusion regions 41a and 41b are formed in the p-type well at both lateral sides of the gate electrode 43. The gate electrode 43 constitutes a part of the word line WL of the FeRAM 40, wherein the structure shows that similar word lines WL extend over the field oxide film 42.

On the Si substrate 41, there are provided an SiON film 44 and an SiO$_2$ film 45 by a CVD process so as to cover the p-type well 41A, the gate electrode 43 and the filed oxide film 43A, and a planarizing layer 46 of SOG is formed further on the SiO$_2$ film 45. Further, two contact holes are formed through the planarization layer 46, the SiO$_2$ film 45 and the SiON film 44 so as to expose the n-type diffusion regions 41a and 41b. The contact holes thus formed are filled by W plugs 45A and 45B.

On the planarization layer 46, an SiON film 47, an SOG film 48 and another SiON film 49 are formed consecutively and a lower electrode 51 of a ferroelectric capacitor 50 is formed on the SiON film 49 by consecutively depositing a Ti layer and a Pt layer. Further, a capacitor insulation film 52 of a ferroelectric material such as PZT is formed on the lower electrode 51 and an upper electrode 53 of Pt is formed on the capacitor insulation film 52.

Further, an Al$_2$O$_3$ protective film 54 is deposited on the SiON film 49 so as to cover the ferroelectric capacitor 50 by either an ECR plasma sputtering process or an induction-coupled high-frequency-plasma-assisted magnetron sputtering process, and the Al$_2$O$_3$ protective film 54 is formed with a thickness of about 20 nm or more, such as about 40 nm, and with a density of about 3.0 g/cm$^3$ or about 3.1 g/cm$^3$, as explained previously with reference to FIG. 7.

On the Al$_2$O$_3$ protective film 54, there is provided an SiO$_2$ film 55 by a CVD process, and an SOG layer 56 is formed further on the SiO$_2$ film 55 for relaxing the step formed in the SiO$_2$ film 55 in correspondence to the ferroelectric capacitor 50.

On the SOG layer 56, there is provided a local interconnection pattern 57 of TiN or W so as to interconnect the upper electrode 53 of the ferroelectric capacitor 50 and the W plug 54B that contacts with the diffusion region 41b. In order to allow the connection of the local interconnection pattern 57 with the ferroelectric capacitor 50, the SiO$_2$ film 55 is formed with a contact hole exposing the upper electrode 53 and another contact hole exposing the W plug 45B. Further, the SiO$_2$ film 55 is formed with a contact hole exposing the lower electrode 51, and another local interconnection pattern 57B makes a contact with the lower electrode 51 at the contact hole.

The local interconnection patterns 57A and 57B are covered by the SiO$_2$ film 58 deposited on the SOG film 56 by a CVD process, and the SiO$_2$ film 58 in turn is formed with a contact hole penetrating through the various of insulation layers underneath so as to expose the W plug 45A contacting the diffusion region 41a. Further, a bit line electrode BL is formed on the SiO$_2$ film 58 so as to make an electrical contact with the W plug 45A via such a through hole.

Further, an $SiO_2$ film 59 is formed on the $SiO_2$ film 58 by a CVD process using an organic silicon source such as an ozone-TEOS source, such that the $SiO_2$ film 59 covers the bit line electrode BL. Further, a passivation film 60 of SiN is formed on the $SiO_2$ film 59 by an ECR plasma CVD process. The SiN passivation film 60 is further covered by a polyimide protective film 61.

In the FeRAM 40 of FIG. 11, the ferroelectric capacitor 50 is covered by a dense $Al_2O_3$ protective film 54. Thus, the PZT film 52 is effectively protected from reduction even when a thermal annealing process is applied after the formation of the capacitor 50 in a reducing $H_2$ atmosphere. Thereby, a large spontaneous polarization is guaranteed for the PZT film 52, and the FeRAM 40 shows an excellent performance as a non-volatile semiconductor memory device. Further, by setting the thickness of the $Al_2O_3$ protective film 54 to be an integer multiple of 40 nm, the optical reflection from the Pt layer constituting the electrode 51 or 53 is suppressed and the photolithographic patterning of the electrodes 51 and 53 is substantially facilitated.

Similarly to the ferroelectric capacitor 10 of the previous embodiment, the FeRAM 40 of the present embodiment may employ various processes such as sputtering, sol-gel process or CVD process for forming the PZT film 52. Further, ferroelectric material such as $SrBi_2Ta_2O_9$ or $Bi_4Ti_2O_{12}$ may also be used in place of the PZT film 52. Further, the lower electrode 51 or upper electrode 53 of the ferroelectric capacitor 50 is not limited to Pt but other metals such as Ir or Ru may also be used. Alternatively, conductive oxide such as $RuO_2$ or $SrRuO_3$ may also be used for the upper or lower electrode.

[Third Embodiment]

Figure 12:
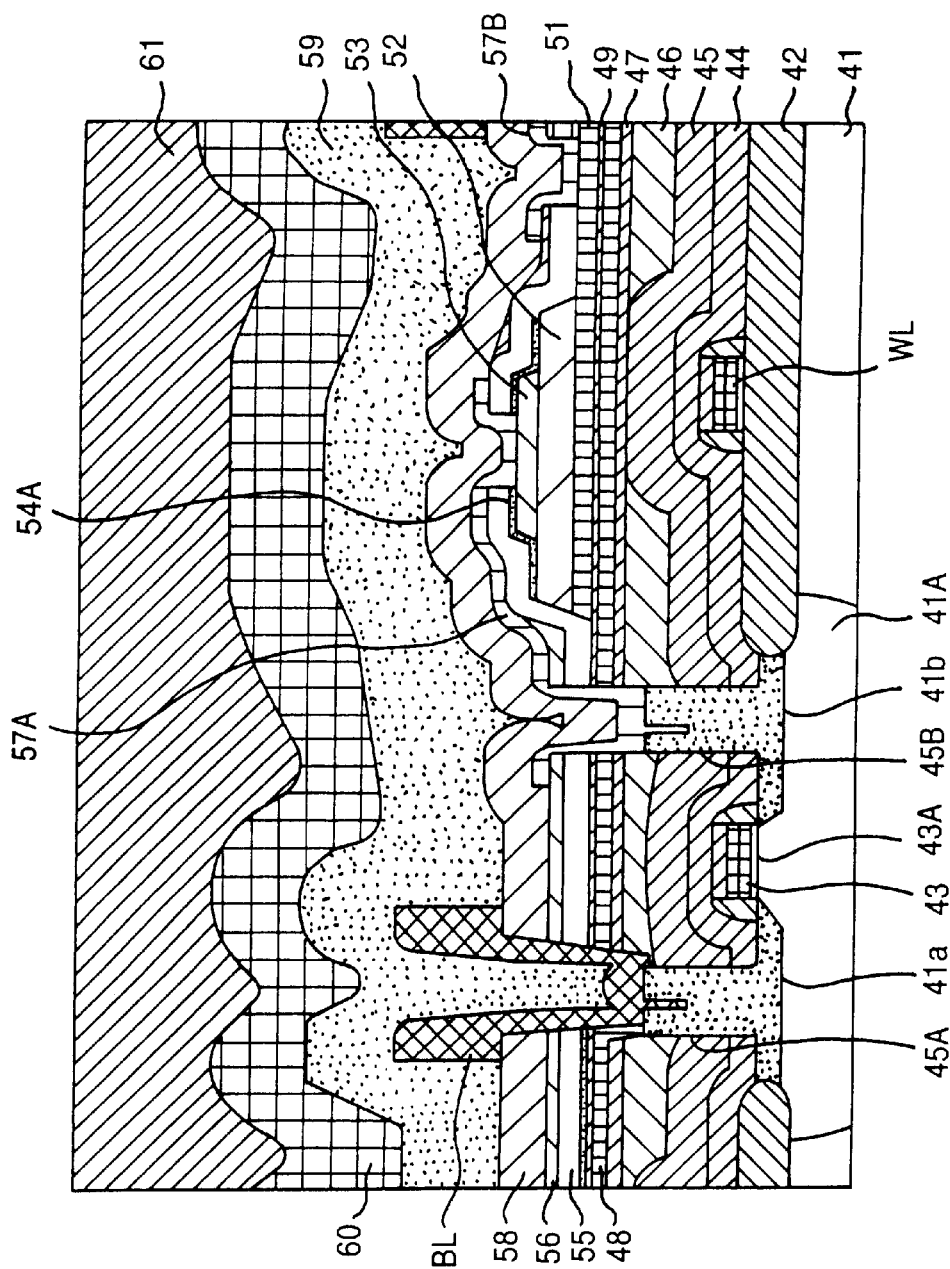
FIG. 12 is a diagram showing the construction of an FeRAM according to a third embodiment of the present invention.

FIG. 12 shows the construction of an FeRAM 70 according to a third embodiment of the present invention, wherein those parts corresponding to the parts described previously are designated by the same reference numerals and the description thereof will be omitted.

Referring to FIG. 13, the FeRAM 70 has a construction substantially identical with the construction of the FeRAM 40 described previously, wherein the $Al_2O_3$ protective film 54 is replaced by an $Al_2O_3$ protective film 54A that covers only the exposed surface of the upper electrode 53 and the PZT film 52. According to such a construction, the $Al_2O_3$ film, which is resistant against etching, is eliminated from the part where the contact holes are formed for connecting the bit line electrode BL or the local interconnection pattern such as the pattern 57A or 57B, and the formation of the contact holes is facilitated.

Further, the present invention is not limited to the embodiments described heretofore, but various variations and modifications may be made without departing from the scope of the invention.

What is claimed is:

1. A ferroelectric capacitor, comprising
a lower electrode;
a lower ferroelectric insulation film formed on said lower electrode;
an upper electrode formed on said ferroelectric insulation film; and
a protective film of $Al_2O_3$ covering said ferroelectric capacitor, wherein
said protective film has a thickness exceeding about 20 nm and a density exceeding about 2.7 $g/cm^3$, or
said protective film has a thickness less than about 20 nm and a density exceeding about 3.0 $g/cm^3$.

2. A ferroelectric capacitor as claimed in claim 1, wherein said protective film has a density of about 3.0 $g/cm^3$ or more and said thickness of said protective film exceeds about 20 nm; or wherein said protective film has a density of about 3.1 $g/cm^3$ or more and said thickness of said protective film is about 20 nm or less.

3. A ferroelectric capacitor as claimed in claim 1, wherein said protective film has a density of about 3.1 $g/cm^3$ or more and said thickness of the protective film is about 50 nm or more.

4. A ferroelectric capacitor as claimed in claim 1, wherein said protective film has a density between about 3.0 $g/cm^3$ and about 3.1 $g/cm^3$ and said thickness of said protective film is between about 20 nm and about 50 nm.

5. A ferroelectric capacitor as claimed in claim 1, wherein said protective film covers a top surface of said upper electrode.

6. A ferroelectric capacitor as claimed in claim 1, wherein said protective film covers a side wall surface of said ferroelectric insulation film.

7. A ferroelectric capacitor, comprising
a lower electrode;
a ferroelectric insulation film formed on said lower electrode;
an upper electrode formed on said ferroelectric insulation film; and
a protective film of $Al_2O_3$ covering said ferroelectric capacitor, wherein
said protective film has a thickness exceeding about 20 nm and shows an etching rate of less than about 100 nm/min against a 10%-diluted buffered HF etching solution containing about 4.9% of $NH_4F$ and about 0.7% of HF, or
said protective film has a thickness less than about 20 nm and shows an etching rate of less than about 50 nm/min against said buffered HF etching solution.

8. A ferroelectric capacitor as claimed in claim 7,
wherein said etching rate is equal to or smaller than about 50 nm/min and said thickness exceeds about 20 nm, or
wherein said etching rate is equal to or smaller than about 30 nm/min and said thickness is equal to or smaller than about 20 nm.

9. A ferroelectric capacitor as claimed in claim 7, wherein said etching rate is equal to or smaller than about 50 nm/min and said thickness is equal to or larger than about 50 nm.

10. A ferroelectric capacitor as claimed in claim 7, wherein said etching rate is between about 30 nm/min and about 50 nm/min and said thickness is between about 20 nm and about 50 nm.

11. A ferroelectric capacitor as claimed in claim 10, wherein said etching rate has a value represented as an interpolation between said etching rate of about 30 nm/min for the case said thickness is about 20 nm and said etching rate of about 50 nm/min for the case said thickness is about 50 nm, when said thickness exceeds 20 nm but not exceeds 50 nm.

12. A ferroelectric capacitor as claimed in claim 7, wherein said protective film covers said upper electrode.

13. A ferroelectric capacitor as claimed in claim 7, wherein said protective film covers a side wall surface of said ferroelectric insulation film.

14. A semiconductor device, comprising:
a ferroelectric capacitor; and
a protective film of $Al_2O_3$ covering said ferroelectric capacitor,
said ferroelectric capacitor comprising a lower electrode, a ferroelectric insulation film formed on said lower electrode, and an upper electrode formed on said ferroelectric insulation film, wherein said protective film has a thickness exceeding about 20 nm and a density exceeding about 2.7 g/cm$^3$, or wherein said protective film has a thickness less than about 20 nm and a density exceeding about 3.0 g/cm$^3$.

15. A semiconductor device as claimed in claim 14, wherein said protective film has a density of about 3.0 g/cm$^3$ or more and said thickness of said protective film exceeds about 20 nm, or wherein said protective film has a density of about 3.1 g/cm$^3$ or more and said thickness of said protective film is about 20 nm or less.

16. A semiconductor device as claimed in claim 14, wherein said protective film has a density of about 3.1 g/cm$^3$ or more and said thickness of the protective film is about 50 nm or more.

17. A semiconductor device as claimed in claim 14, wherein said protective film has a density between about 3.0 g/cm$^3$ and about 3.1 g/cm$^3$ and said thickness of said protective film is between about 20 nm and about 50 nm.

18. A semiconductor device as claimed in claim 14, wherein said protective film covers a top surface of said upper electrode.

19. A semiconductor device as claimed in claim 14, wherein said protective film covers a side wall surface of said ferroelectric insulation film.

20. A semiconductor device, comprising:

a ferroelectric capacitor; and a protective film of Al$_2$O$_3$ covering said ferroelectric capacitor, said ferroelectric capacitor comprising a lower electrode, a ferroelectric insulation film formed on said lower electrode and an upper electrode formed on said ferroelectric insulation film, wherein said protective film has a thickness exceeding about 20 nm and shows an etching rate of less than about 100 nm/min against a 10%-diluted buffered HF etching solution containing about 4.9% of NH$_4$F and about 0.7% of HF, or wherein said protective film has a thickness less than about 20 nm and shows an etching rate of less than about 50 nm/min against said buffered HF etching solution.

21. A semiconductor device as claimed in claim 20, wherein said etching rate is equal to or smaller than about 50 nm/min and said thickness exceeds about 20 nm, or wherein said etching rate is equal to or smaller than about 30 nm/min and said thickness is equal to or smaller than about 20 nm.

22. A semiconductor device as claimed in claim 20, wherein said etching rate is equal to or smaller than about 50 nm/min and said thickness is equal to or larger than about 50 nm.

23. A semiconductor device as claimed in claim 20, wherein said etching rate is between about 50 nm/min and about 30 nm/min and said thickness is between about 20 nm and about 50 nm.

24. A semiconductor device as claimed in claim 23, wherein said etching rate has a value represented as an interpolation between said etching rate of about 30 nm/min for the case said thickness is about 20 nm and said etching rate of about 50 nm/min for the case said thickness is about 50 nm, when said thickness exceeds 20 nm but not exceeds 50 nm.

25. A semiconductor device as claimed in claim 20, wherein said protective film covers said upper electrode.

26. A semiconductor device as claimed in claim 20, wherein said protective film covers a side wall surface of said ferroelectric insulation film.

* * * * *